United States Patent
Cheng et al.

(10) Patent No.: US 9,704,958 B1
(45) Date of Patent: Jul. 11, 2017

(54) III-V FIELD EFFECT TRANSISTOR ON A DIELECTRIC LAYER

(71) Applicant: International Business Machines Corporation, Armonk, NY (US)

(72) Inventors: Cheng-Wei Cheng, White Plains, NY (US); Edward William Kiewra, South Burlington, VT (US); Amlan Majumdar, White Plains, NY (US); Devendra K. Sadana, Pleasantville, NY (US); Kuen-Ting Shiu, Yorktown Heights, NY (US); Yanning Sun, Scarsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/974,019

(22) Filed: Dec. 18, 2015

(51) Int. Cl.
*H01L 21/02* (2006.01)
*H01L 29/20* (2006.01)
*H01L 29/10* (2006.01)
*H01L 29/161* (2006.01)
*H01L 29/16* (2006.01)
(Continued)

(52) U.S. Cl.
CPC ...... *H01L 29/2003* (2013.01); *H01L 21/0254* (2013.01); *H01L 21/02543* (2013.01); *H01L 21/02546* (2013.01); *H01L 21/02549* (2013.01); *H01L 29/0649* (2013.01); *H01L 29/1037* (2013.01); *H01L 29/161* (2013.01); *H01L 29/1608* (2013.01); *H01L 29/66522* (2013.01)

(58) Field of Classification Search
CPC ............. H01L 29/2003; H01L 29/1608; H01L 21/02546; H01L 29/0649; H01L 29/161; H01L 29/66522; H01L 21/02549; H01L 21/02543; H01L 29/1037; H01L 21/0254
USPC ...................................................... 438/1–983
See application file for complete search history.

(56) References Cited

U.S. PATENT DOCUMENTS 6,171,936 B1 1/2001 Fitzgerald
7,247,534 B2 7/2007 Chidambarrao et al.
(Continued)

OTHER PUBLICATIONS

Adam et al., "Semiconductor Structure With Aspect Ratio Trapping Capabilities", U.S. Appl. No. 13/925,911, filed Jun. 25, 2013, 20 pages.
(Continued)

*Primary Examiner* — Hoang-Quan Ho
(74) *Attorney, Agent, or Firm* — Cantor Colburn LLP

(57) ABSTRACT

An electrical device comprising a base semiconductor layer of a silicon including material; a dielectric layer present on the base semiconductor layer; a first III-V semiconductor material area present in a trench in the dielectric layer, wherein a via of the III-V semiconductor material extends from the trench through the dielectric layer into contact with the base semiconductor layer; a second III-V semiconductor material area present in the trench in the dielectric layer wherein the second III-V semiconductor material area does not have a via extending through the dielectric layer into contact with the base semiconductor layer; and a semiconductor device present on the second III-V semiconductor material area, wherein the first III-V semiconductor material area and the second III-V semiconductor material area are separated by a low aspect ratio trench extending to the dielectric layer.

15 Claims, 11 Drawing Sheets

(51) Int. Cl.
*H01L 29/06* (2006.01)
*H01L 29/66* (2006.01)

(56) References Cited

U.S. PATENT DOCUMENTS

| | | | | |
|---|---|---|---|---|
| 7,435,639 B2* | 10/2008 | Winstead | ............... | H01L 21/84 257/E21.632 |
| 7,834,456 B2 | 11/2010 | Tabatabaia et al. | | |
| 8,120,060 B2 | 2/2012 | Fitzgerald | | |
| 8,253,211 B2 | 8/2012 | Cheng et al. | | |
| 8,274,097 B2* | 9/2012 | Cheng | ............... | H01L 21/02532 257/190 |
| 8,324,660 B2* | 12/2012 | Lochtefeld | ........ | H01L 21/02381 257/190 |
| 8,384,196 B2* | 2/2013 | Cheng | ............... | H01L 21/02381 257/618 |
| 8,610,172 B2 | 12/2013 | Gou et al. | | |
| 8,878,243 B2* | 11/2014 | Lochtefeld | ........ | H01L 21/02647 257/14 |
| 9,123,633 B2* | 9/2015 | Lee | ............... | H01L 29/20 |
| 9,159,554 B2* | 10/2015 | Sanchez | ............ | H01L 21/02381 |
| 9,287,115 B2* | 3/2016 | Cheng | ............... | H01L 21/02488 |
| 2007/0166901 A1* | 7/2007 | Lee | ............... | H01L 29/78603 438/164 |
| 2007/0281446 A1* | 12/2007 | Winstead | ............... | H01L 21/84 438/478 |
| 2010/0213511 A1* | 8/2010 | Lochtefeld | ........ | H01L 21/02647 257/190 |
| 2011/0272762 A1* | 11/2011 | Booth, Jr. | ............... | H01L 21/84 257/347 |
| 2013/0119507 A1* | 5/2013 | Lee | ................... | H01L 21/82380 257/506 |
| 2014/0217499 A1* | 8/2014 | Lee | ........................ | H01L 29/20 257/334 |
| 2014/0220751 A1* | 8/2014 | Lee | ................... | H01L 29/66795 438/283 |
| 2014/0329376 A1* | 11/2014 | Sanchez | ............ | H01L 21/02381 438/492 |
| 2015/0262818 A1* | 9/2015 | Cheng | ............... | H01L 21/02488 257/615 |
| 2015/0333481 A1* | 11/2015 | Van Thourhout | ........ | H01S 5/021 372/45.01 |

OTHER PUBLICATIONS

Cheng et al., "Planar III-V Field Effect Transistor (FET) on Dielectric Layer", U.S. Appl. No. 14/206,220, filed Mar. 12, 2014, 39 pages.

Takagi et al., "III-V/Ge CMOS technologies on Si platform", Symposium on VLSI Technnology (VLSIT), 2010, pp. 147-148.

Wu et al., "Atomic-layer-deposited Al2O3/GaAs metal-oxide-semiconducor field-effects transistor on Si substrate using aspect ratio trapping technique", Applied Physics Letters, vol. 93, 242106, 2008, 3 pages.

* cited by examiner

III-V FIELD EFFECT TRANSISTOR ON A DIELECTRIC LAYER

BACKGROUND

For more than three decades, the continued miniaturization of silicon metal oxide semiconductor field effect transistors (MOSFETs) has driven the worldwide semiconductor industry. Various hurdles to continued scaling have been predicted for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, methods for improving performance without scaling have gained increasing importance.

SUMMARY

Described herein is a method of forming a semiconductor device comprising: forming a trench in a dielectric layer, the dielectric layer being present on a semiconductor substrate; forming a via within the trench, wherein the via extending from a base of the trench present at a depth within the dielectric layer to an exposed upper surface of the semiconductor substrate; epitaxially forming a III-V semiconductor material extending from the exposed upper surface of the semiconductor substrate filling at least a portion of the trench; forming a low aspect ratio trench in the epitaxially formed III-V semiconductor to result in a first III-V semiconductor area comprising the via and a second III-V semiconductor area free of the via; and forming the semiconductor device on the second III-V semiconductor area.

Described herein is a method of forming a semiconductor substrate comprising: forming a trench in a dielectric layer, the dielectric layer being present on a semiconductor substrate; forming a via within the trench, wherein the via extending from a base of the trench present at a depth within the dielectric layer to an exposed upper surface of the semiconductor substrate; epitaxially forming a III-V semiconductor material extending from the exposed upper surface of the semiconductor substrate filling at least a portion of the trench; and forming a low aspect ratio trench in the epitaxially formed III-V semiconductor.

Also described herein is an electrical device comprising: a base semiconductor layer of a silicon including material; a dielectric layer present on the base semiconductor layer; a first III-V semiconductor material area present in a trench in the dielectric layer, wherein a via of the III-V semiconductor material extends from the trench through the dielectric layer into contact with the base semiconductor layer; a second III-V semiconductor material area present in the trench in the dielectric layer wherein the second III-V semiconductor material area does not have a via extending through the dielectric layer into contact with the base semiconductor layer; and a semiconductor device present on the second III-V semiconductor material area, wherein the first III-V semiconductor material area and the second III-V semiconductor material area are separated by a low aspect ratio trench extending to the dielectric layer.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing features are apparent from the following detailed description taken in conjunction with the accompanying drawings in which:

DETAILED DESCRIPTION

Figure 1:
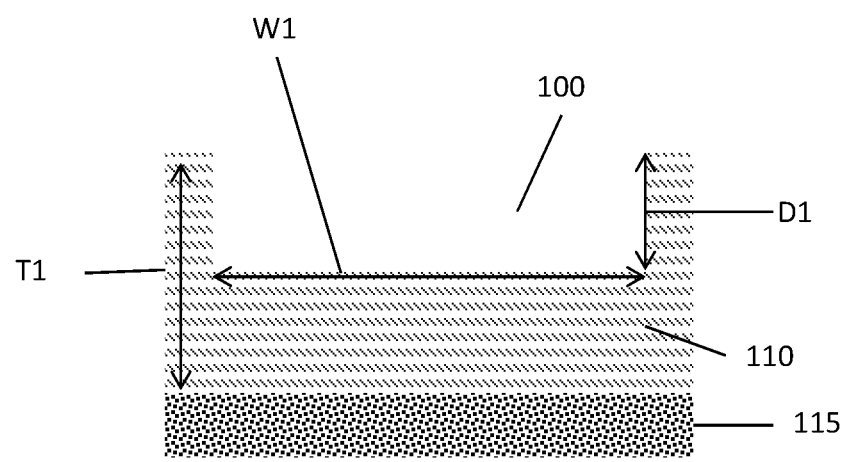
FIG. 1 shows a starting substrate.

Described herein is method for making a semiconductor substrate which results in a semiconductor device that is isolated and has little or no ability for leakage within source and drain, or with another device through the silicon substrate. Current solutions to the issues of leakage, particularly with nFET devices, employ high aspect ratio trenches which require deep-gap fill with a dielectric. Deep-gap fill can be problematic with the presence of voids or gaps due to uneven filling. The method described herein overcomes these issues by providing a way to isolate the semiconductor device without employing a high aspect ratio trench. A low aspect ratio trench is made in the III-V semiconductor material between the device and the via to the substrate. The low aspect ratio trench isolates the device from the via. The low aspect ratio trench can be filled with a specific dielectric in a specific step or at least partially filled with a dielectric as a result of other steps required for making the device.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value.

Yet, in another aspect, the term "about" means within 10, 9, 8, 7, 6, 5, 4, 3, 2, or 1% of the reported numerical value.

In some embodiments, the methods and structures disclosed herein are related to forming semiconductor devices on type III-V semiconductor materials. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. For example, when the dominant carrier concentration is electrons, the semiconductor device is referred to as being an n-type semiconductor device; and when the dominant carrier concentration is holes, the semiconductor device is referred to as being a p-type semiconductor device.

In some embodiments, the semiconductor devices suitable for use with methods and structures disclosed herein are field effect transistors (FETs). A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region underlying the gate structure and between the source and drain of a semiconductor device that becomes conductive when the semiconductor device is turned on.

It is noted that the semiconductor devices for use with the methods and structures disclosed herein are not limited to only field effect transistors. Any planar semiconductor device is suitable for use with the methods and structures that are disclosed herein. The term "planar" as used to describe a semiconductor device orientation denotes that the direction of charge carriers from the source region to the drain region of the semiconductor device is along a plane that is parallel to the upper surface of the substrate, wherein a gate structure is present on the upper surface of the substrate. For example, the planar semiconductor device that is suitable for use with the present application includes junction field effect transistors (JFET), Schottky barrier devices, bipolar junction transistors having the appropriate planar orientation, flash memory devices, high-electron-mobility-transistor (HEMT), and combinations thereof.

A type "III-V" semiconductor material denotes a semiconductor material that includes at least one element from Group IIIA (group 13 under the modem International Union of Pure and Applied Chemistry (IUPAC)) and at least one element from Group VA (group 15 under the modem International Union of Pure and Applied Chemistry (IUPAC)) of the Periodic Table of Elements. Typically, the III-V compound semiconductors are binary, ternary or quaternary alloys including IIIN elements.

It has been determined that forming planar semiconductor devices on type III-V semiconductor materials sitting on top of the low-k dielectrics reduces short channel effects. The short channel effect is the decrease of threshold voltage as the channel length is reduced. The low-k layer right below the MOSFET can impede the crosstalk of electric field between the source region and the drain region, and therefore mitigate short channel effect. Low defect density and single crystalline III-V semiconductor materials can not be directly formed on dielectric materials. Further direct wafer bonding techniques are complicated, and are expensive for mass production of complementary metal oxide semiconductor (CMOS) devices.

FIG. 1 depicts one embodiment of forming a trench 100 in a dielectric layer 110 that is present on a semiconductor substrate 115. In one embodiment, the semiconductor substrate 115 is a bulk semiconductor substrate. A "bulk semiconductor substrate" is a substrate that is composed of a single semiconductor material. The semiconductor material that provides the bulk semiconductor substrate may be a semiconducting material including, but not limited to silicon, strained silicon, a silicon carbon alloy (SiC), silicon germanium (SiGe), a silicon germanium and carbon alloy (SiGeC), silicon alloys, germanium, germanium alloys, gallium arsenic, indium arsenic, indium phosphide, as well as other III-V and II-VI compound semiconductors. In other embodiments, the semiconductor substrate 115 may be a semiconductor on insulator (SOI) substrate. An SOI substrate includes a first semiconductor layer (also referred to as SOI layer) on a buried dielectric layer, wherein the buried dielectric layer is present on a second semiconductor layer (also referred to as base semiconductor layer).

In some embodiments, the upper surface of the semiconductor substrate 115 is a crystalline material, such as a single crystal material. The term "crystalline" includes nanocrystalline, polycrystalline or microcrystalline. The term "single crystalline" denotes a crystalline solid, in which the crystal lattice of the entire sample is substantially continuous and substantially unbroken to the edges of the sample, with substantially no grain boundaries.

The dielectric layer 110 may be formed on the upper surface of the semiconductor substrate 115. The dielectric layer 110 may be composed of an oxide, nitride or oxynitride material layer. In one example, when the dielectric layer 110 is composed of an oxide, the dielectric layer 110 may be composed of silicon oxide (SiO2). In some embodiments, the dielectric layer 110 may be composed of a low-k dielectric material. As used herein, the term "low-k" denotes a dielectric constant of 4.0 or less measured from a dielectric at room temperature, e.g., 20° C. to 25° C., and at atmospheric pressure, e.g., 1 atm. In some embodiments, a dielectric layer 110 having a low-k dielectric has a dielectric constant ranging from 1.0 to 3.0. In some embodiments, a low-k dielectric layer 110 comprises SiCOH or an aromatic hydrocarbon polymer composition, such as SILK™. In other embodiments, the low-k dielectric layer 110 comprises carbon-doped oxides. In other embodiments, the low-k dielectric layer 110 comprises an undoped silica glass. In other embodiments, the low-k dielectric layer 110 is composed of diamond-like carbon (DLC). In other embodiments, the low-k dielectric layer 110 is non-porous. In other embodiments, the low-k dielectric layer 110 is porous.

The deposition process for forming the dielectric layer 110 can comprise chemical vapor deposition (CVD), plasma enhanced chemical vapor deposition (PECVD), physical vapor deposition (PVD), high-density plasma CVD or spin-on glass process. The dielectric layer can have a thickness T1 of 10 nanometers (nm) to 1000 nm, or 100 nm to 500 nm.

FIG. 1 further depicts a trench 100 in the dielectric layer 115. The trench 100 may be formed by deposition, photo-lithography and a selective etching process. Specifically, a first photoresist etch mask (not shown) is produced on the dielectric layer 110 by depositing a photoresist material layer onto the surface to be etched, exposing the photoresist material layer to a pattern of radiation, and then developing the patterned material into a first photoresist etch mask utilizing a resist developer. Once the patterning of the photoresist material is completed, the sections covered by the first photoresist etch mask are protected, while the exposed regions are removed using a selective etching process that removes the unprotected regions of the dielectric layer 110 to provide the trench 100. The etch process may be an anisotropic etch process, such as reactive ion etch (RIE). The etch process for forming the trench 100 recesses the dielectric layer 110, but does not remove the entirety of the dielectric layer 110 to expose the semiconductor substrate 115. Following etching, the first photoresist etch mask may be removed using selective etching, chemical stripping or oxygen ashing.

The trench 100 may have a depth D1 of 1 nm to 1000 nm or, 5 nm to 30 nm. The trench 100 may have a width W1 of 10 nm to 10000 nm, or, 30 nm to 100 nm.

Figure 2:
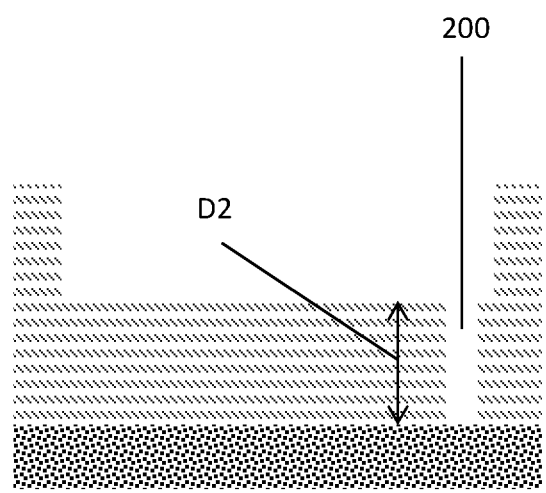
FIG. 2 shows the substrate if FIG. 1 after formation of a via.
Figure 3:
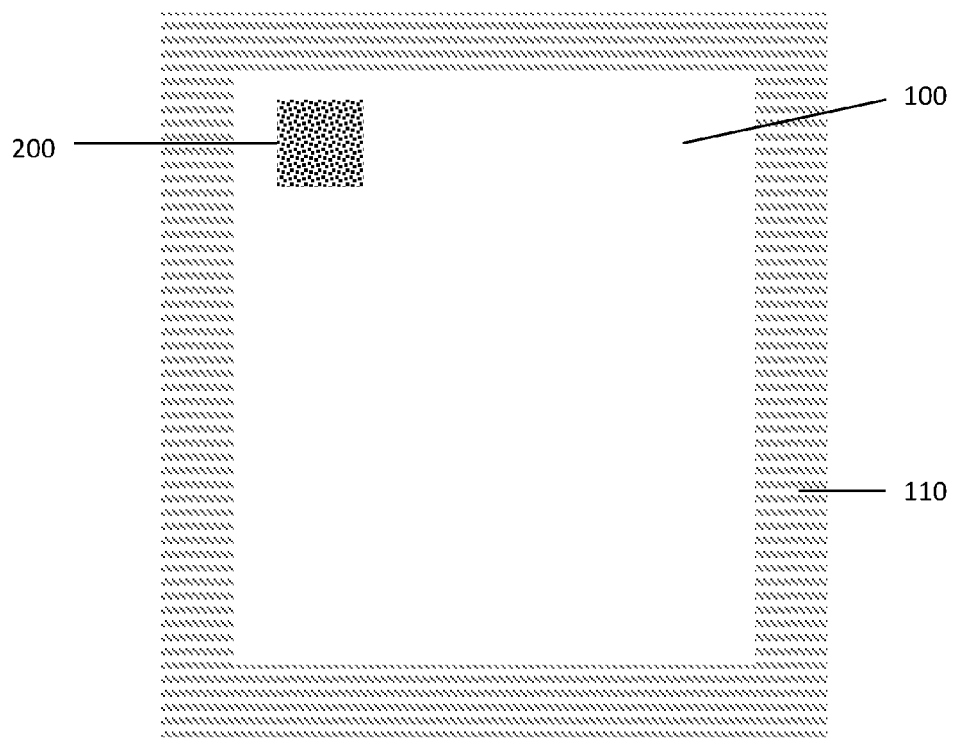
FIG. 3 is a top view of the structure of FIG. 2.

FIG. 2 and FIG. 3 depict forming a via 200 within the trench 100 extending from a base of the trench 100 to an exposed upper surface of the semiconductor substrate 115. In some embodiments, the via 200 may be formed using photolithography and etch processes similar to the method of forming the trench 115 that is described above. For example, a second photoresist etch mask (not shown) is produced on the dielectric layer 110 and the trench 100 by depositing a photoresist material layer onto the surface to be etched, exposing the photoresist material layer to a pattern of radiation, and then developing the patterned material into a second photoresist etch mask utilizing a resist developer. Once the patterning of the photoresist material is completed, the sections of the trench 100 and dielectric layer 110 covered by the second photoresist etch mask are protected, while the exposed portion of the dielectric layer 110 that provides a portion of the base surface of the trench 100 is removed using a selective etch process.

The selective etch process for forming the via 200 is an etch process that removes the unprotected regions of the dielectric layer 110 selectively to the second photoresist etch mask and the semiconductor substrate 115. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater, e.g., 1000:1.

The etch process for forming the via 200 may be an anisotropic etch process. As used herein, an "anisotropic etch process" denotes a material removal process in which the etch rate in the direction normal to the surface to be etched is greater than in the direction parallel to the surface to be etched. The anisotropic etch may include reactive-ion etching (ME). Other examples of anisotropic etching that can be used include ion beam etching, plasma etching or laser ablation. The etch process may also be timed and/or employ end point detection methods to determine when the etch process has reached and exposed a surface of the semiconductor substrate 115. Following etching to form the via 200, the second photoresist etch mask may be removed using selective etching, chemical stripping or oxygen ashing.

The via 200 may have a depth D2 of 1 nm to 500 nm, or, 10 nm to 50 nm. The via 200 may have a width W2 of 1 nm to 1000 nm, or, 5 nm to 50 nm. The via 200 is positioned exterior of a drain region or source region of the subsequently formed semiconductor device. FIG. 3 is a top down view depicting a via 200 having a multi-sided shape. It is noted that the via 200 is not limited to only this geometry. For example, the via 200 may have a circular or oblong shape when view from the top down perspective.

Figure 4:
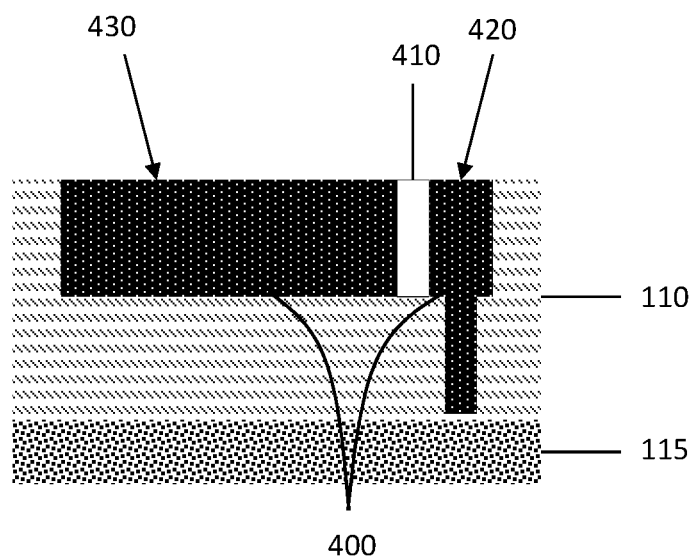
FIG. 4 shows the structure of FIG. 2 after epitaxial growth of III-V semiconductor material and a formation of a trench in the III-V material.

FIG. 4 depicts epitaxially forming a type III-V semiconductor material 400 extending from the exposed upper surface of the semiconductor substrate 115 filling the via 200 and filling at least a portion of the trench 100. In one embodiment, the III-V semiconductor material 400 may be composed of at least one material selected from the group consisting of from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The terms "epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

The exposed upper surface of the semiconductor substrate 115 provides the seed surface for epitaxial growth of the III-V semiconductor material 400. More specifically, epitaxially growth of the III-V semiconductor material 400 starts at the exposed upper surface of the semiconductor substrate 115 filling the via 200 as the deposition process continues, wherein once the via 200 is filled the epitaxially III-V semiconductor material 400 grows from the via 200 into the trench 100. As the epitaxially growth process continues, the III-V semiconductor material 400 may fill the trench 100, wherein epitaxial III-V semiconductor material 400 is in direct contact with the base surface and the sidewall surfaces of the trench 100. In some embodiments, the epitaxial growth may continue after the trench 100 is entirely filled and until a portion of the epitaxial III-V semiconductor material 400 extends from the trench 100 onto the upper surface of the dielectric layer 110 at the exterior of the trench 100. In such an instance, the excess epitaxial III-V semiconductor material 400 can be removed by, for example, a suitable etching process or chemical mechanical polishing (CMP).

A number of different sources may be used for the deposition of epitaxial III-V semiconductor material 400. In some embodiments, the sources for epitaxial growth of type III-V semiconductor material 400 include solid sources containing In, Ga, N, P elements and combinations thereof and/or a gas precursor selected from the group consisting oftrimethylgallium (TMG), trimethylindium (TMI), tertiary-butylphosphine (TBP), phosphine ($PH_3$), ammonia ($NH_3$), and combinations thereof. The temperature for epitaxial deposition of type III-V semiconductor materials typically ranges from 550° C. to 900° C. Although higher temperature typically results in faster deposition, the faster deposition may result in crystal defects and film cracking. The deposition chamber for the epitaxial growth process may be provided by a chemical vapor deposition apparatus, such as a plasma enhanced chemical vapor deposition apparatus or a metal organic chemical vapor deposition apparatus.

The type III-V semiconductor material 400 that is epitaxially grown from the exposed upper surface of the semiconductor substrate 115 is typically a crystalline material, such as a single crystalline material. In some embodiments, the portion of the epitaxial III-V semiconductor material 400 that is present within the via 200 and in direct contact with the exposed surface of the semiconductor substrate 115 may have a concentration, i.e., surface density, of crystalline defects that is greater than $1 \times 10^9$ defects/$cm^2$. The crystalline defects may be dislocation defects, point defects, stacking faults and combinations thereof. In one embodiment, the concentration, i.e., surface density, of crystalline defects that are present may range from $1 \times 10^{10}$ defects/$cm^2$ to $1 \times 10^7$ defects/$cm^2$.

As the type III-V semiconductor material 400 grows from the seed surface, i.e., exposed upper surface of the semiconductor substrate 115, through the via 200 into the trench 100, the defect density is reduced. The concentration of defects in the type III-V semiconductor material 400 that is present in the trench 100 may equal to $1 \times 10^6$ defects/$cm^2$ or less, and may be referred to as having a low defect density. In one embodiment, the defect density within the type III-V semiconductor material 400 that is present in the trench 100 may be $1 \times 10^3$ defects/$cm^2$ to $1 \times 10^7$ defects/$cm^2$, or, $1 \times 10^5$ defects/$cm^2$ to $1 \times 10^7$ defects/$cm^2$. It is noted that the above description of defect densities is provided for illustrative purposes only, and is not intended to limit the disclosure to only the disclosed ranges.

The upper surface of the type III-V semiconductor material 400 may be planarized so that the upper surface of the type III-V semiconductor material 400 is coplanar with the upper surface of the dielectric layer 1 10. The upper surface may be planarized using a mechanical method such as chemical mechanical planarization (CMP) or grinding.

The low aspect ratio trench 410 is formed in the semiconductor material 400 using photolithography and etch processes similar to the method of forming the trench 115 and via 200 that is described above. For example, a third photoresist etch mask (not shown) is produced on the semiconductor material 400 and dielectric material 110 by depositing a photoresist material layer onto the surface to be etched, exposing the photoresist material layer to a pattern of radiation, and then developing the patterned material into a second photoresist etch mask utilizing a resist developer. Once the patterning of the photoresist material is completed, the sections of the semiconductor material 400 and dielectric layer 110 covered by the second photoresist etch mask are protected, while the exposed portion of the semiconductor material 400 is removed using a selective etch process.

The etch process for forming the low aspect ratio trench 410 may be an anisotropic etch process. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used include ion beam etching, plasma etching or laser ablation. The etch process may also be timed and/or employ end point detection methods to determine when the etch process has reached and exposed a surface of the dielectric layer 110. Following etching to form the low aspect ratio trench 410, the third photoresist etch mask may be removed using selective etching, chemical stripping or oxygen ashing.

The low aspect ratio trench 410 may have a depth D3 of 1 nm to 100 nm, or, 10 nm to 50 nm. The low aspect ratio trench 410 may have a width W3 of 5 nm to 1000 nm, or, 10 nm to 100 nm. The aspect ratio (D3/W3) of the low aspect ratio trench 410 can be less than or equal to 2. The trench is located so as to form two III-V semiconductor material areas, 420 and 430. The first III-V semiconductor material area 420 comprises the via 200 filled with III-V semiconductor material and is positioned exterior of a drain region or source region of the subsequently formed semiconductor device. The second III-V semiconductor material area 430 does not comprise a via and is positioned under the drain region, source region or both the source and drain of the subsequently formed semiconductor device.

Figure 5:
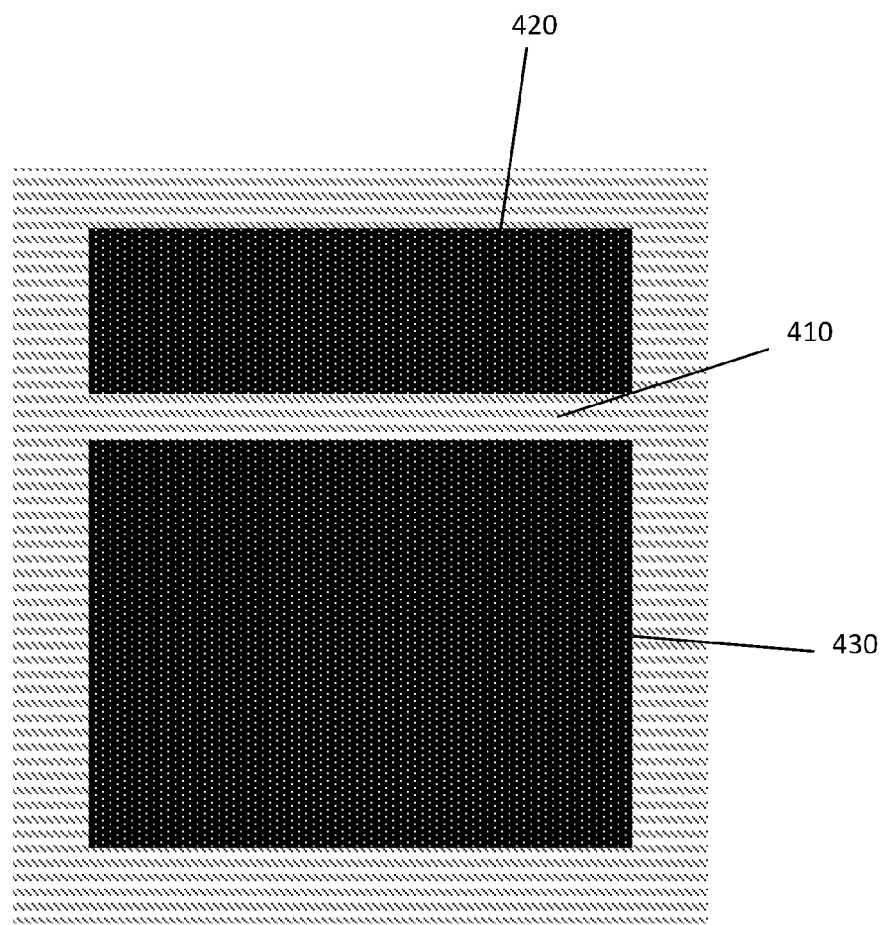
FIG. 5 is a top view of FIG. 4.

FIG. 5 is a top view of the structure of FIG. 4 showing the low aspect ratio trench 410, the first III-V semiconductor material area 420 and the second semiconductor material area 430.

Figure 6:
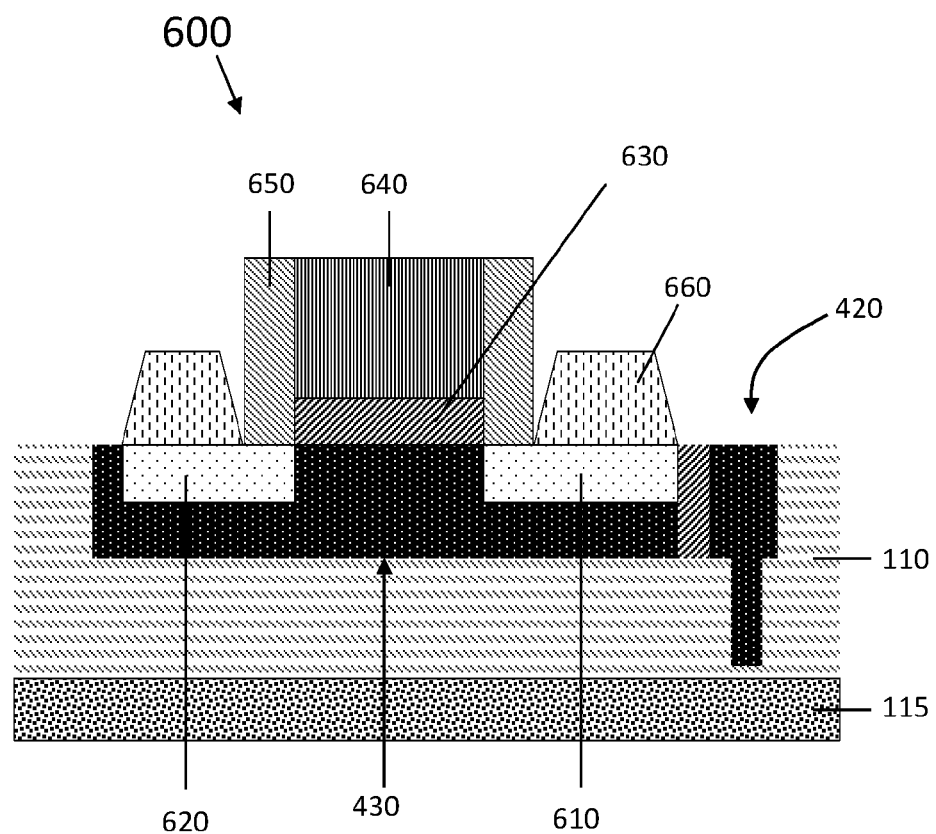
FIG. 6 shows a completed semiconductor device using the structure of FIG. 4.

Now turning to FIG. 6, a completed semiconductor device 600 is shown. The semiconductor device 600 may be a field effect transistor including a gate structure that is positioned on a channel region portion of the type III-V semiconductor material 400 with source and drain regions 610, 620 on opposing sides of the channel region portion. As used herein, the term "drain" means a doped region in semiconductor device located at the end of the channel region, in which carriers are flowing out of the device through the drain. The term "source" is a doped region in the semiconductor device, in which majority carriers are flowing into the channel region. The channel region is the region underlying the gate structure and between the source and drain regions 610, 620 of a semiconductor device that becomes conductive when the semiconductor device is turned on. The term "gate structure" means a structure used to control output current (i.e., flow of carriers in the channel) of a semiconducting device through electrical or magnetic fields.

Each of the gate structures for semiconductor devices of the field effect transistor type include at least one gate dielectric 630 that is present on the channel portion of the semiconductor device and at least one gate conductor 640 that is present on the at least one gate dielectric 630. The gate dielectric 630 may be composed of a dielectric material, such as an oxide, nitride or oxynitride material. For example, the at least one gate dielectric 630 may be composed of silicon oxide. The gate dielectrics 630 may include high-k materials that may include, but are not limited to hafnium oxides, hafnium silicates, zirconium oxides, lanthanum oxides, titanium oxides, barium-strontium-titantates (BSTs) and lead-zirconate-titanates (PZTs). The low aspect ratio trench 410 can be at least partially filled with the gate dielectric 630 and may show some surface features as a result of the deposition of the dielectric material. The gate conductor 640 may be composed of an electrically conductive material, such as a doped semiconductor or a metal. For example, the gate conductor 640 may be composed of n-type doped polysilicon. In other examples, the gate conductor may be composed of a metal having a work function suitable for enhancing the electrical properties of n-type or p-type semiconductor devices. The gate structures may be formed using deposition, photolithography and etch processes. For example, a gate layer stack may be formed using by depositing at least one gate dielectric material layer on III-V semiconductor material 400, and then depositing at least one gate conductor material layer on the at least one gate dielectric material layer. The gate layer stack is then patterned and etched to provide the gate structure.

In some embodiments, a gate sidewall spacer 650 may be formed on the sidewall of the gate structure. The gate sidewall spacer 650 may be composed of a dielectric, such as an oxide, nitride or oxynitride material. The gate sidewall spacer 650 may be formed by deposition and etch back processes.

The source region 610 and drain region 620 may then be formed in the III-V semiconductor material 400. The source region 610 and the drain region 620 may be formed by doping portions of the type III-V semiconductor material 400 using ion implantation. The effect of the dopant atom in the type III-V semiconductor material 400, i.e., whether it is a p-type or n-type dopant, depends upon the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities.

In some embodiments, metal semiconductor alloy contacts 660 may be formed on the upper surface of the source region 610 and the drain region 620. In some embodiments, the formation of the metal semiconductor alloy contacts 660 typically requires depositing a refractory metal such as Ni or Ti onto the surface of a semiconductor containing material or wafer. Following deposition, the structure is then subjected to an annealing step using conventional processes such as, but not limited to, rapid thermal annealing. During thermal annealing, the deposited metal reacts with the semiconductor material forming a metal semiconductor.

Figure 7:
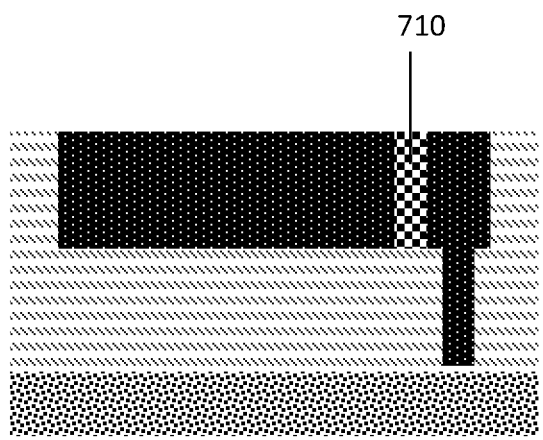
FIG. 7 shows an alternate intermediate structure between FIG. 4 and FIG. 6.

FIG. 7 is another embodiment in which the low aspect ratio trench as shown in FIG. 4 is filled with a dielectric material 710. To fill the low aspect ratio trench the III-V semiconductor material 400 and the dielectric 110 can be masked and the dielectric material deposited. After the dielectric material is deposited the mask is removed and the structure can be planarized. The dielectric material 710 can comprise an oxide, nitride or oxynitride material. For example, the dielectric 710 may be composed of silicon oxide. The dielectrics 710 may include high-k materials such as hafnium oxides, hafnium silicates, zirconium oxides, lanthanum oxides, titanium oxides, barium-strontium-titantates (BSTs) and lead-zirconate-titanates (PZTs).

A semiconductor device as described above can be formed, as described above, on the structure of FIG. 7. The semiconductor structure is shown in FIG. 8.

Figure 9:
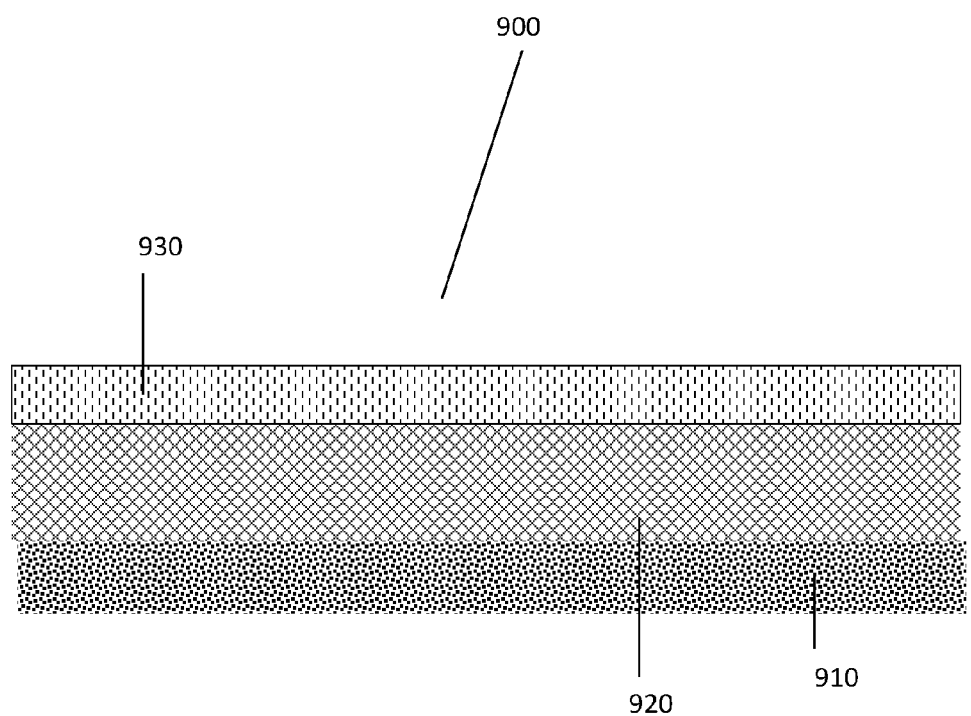
FIG. 9 shows a hybrid substrate.

FIG. 9 depicts an embodiment of a semiconductor on insulator (SOI) substrate 900 for use in the methods and articles described herein. The semiconductor on insulator (SOI) substrate 900 may include at least a first semiconductor layer 930 (also referred to as a semiconductor on insulator (SOI) layer) overlying a dielectric layer 920, in which a base semiconductor layer 910 may be present underlying the dielectric layer 920. The semiconductor material that provides the semiconductor on insulator layer 930 may be any semiconducting material including, but not limited to Si, strained Si, SiC, SiGe, SiGeC, Si alloys, Ge, Ge alloys, GaAs, InAs, and InP, or any combination thereof. In one example, the semiconductor on insulator layer 930 is composed of silicon. The semiconductor on insulator layer 930 can have a thickness of 5.0 nm to 15.0 nm, or, 7.5 nm to 12.5 nm. The base semiconductor layer 910 may be a semiconducting material including, but not limited to Si, strained Si, SiC, SiGe, SiGeC, Si alloys, Ge, Ge alloys, GaAs, InAs, InP as well as other III-V and II-VI compound semiconductors. The base semiconductor layer 910 may have the same or a different composition than the semiconductor on insulator layer 930.

Figure 8:
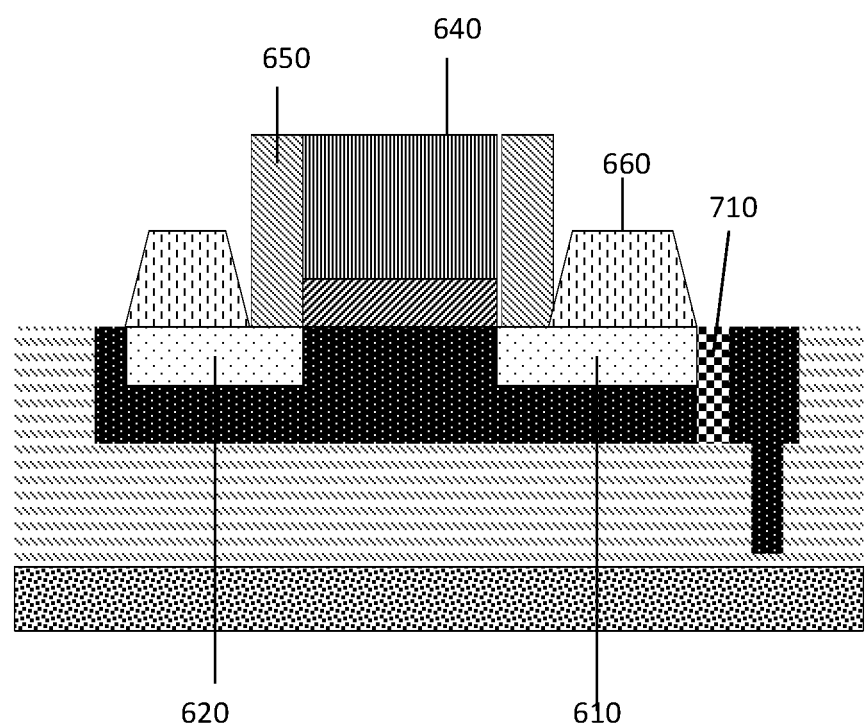
FIG. 8 shows a completed semiconductor device using the structure of FIG. 7.
Figure 10:
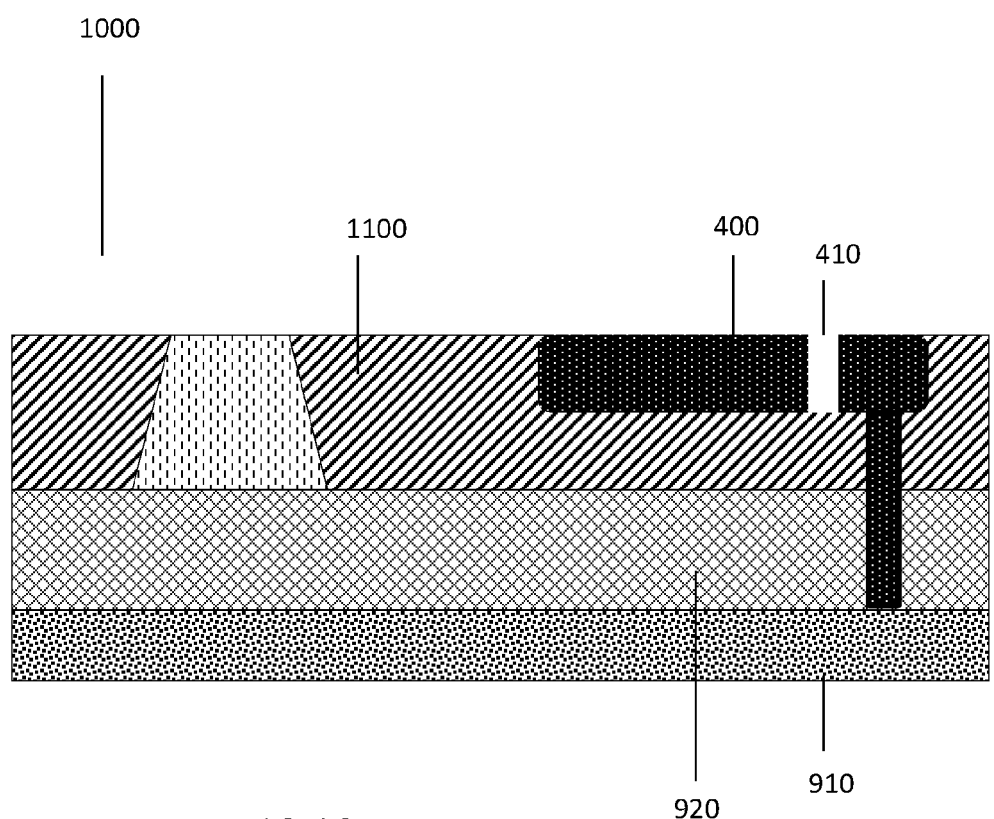
FIG. 10 shows an alternate embodiment to FIG. 4 using a hybrid substrate.
Figure 11:
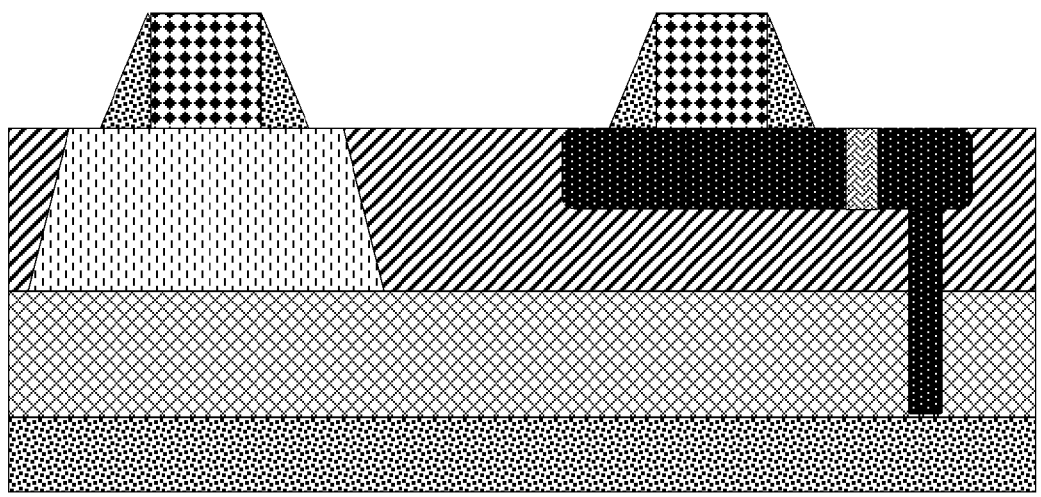
FIG. 11 shows completed semiconductor devices using the structure of FIG. 10.

FIG. 10 depicts patterning the SOI layer 930 of the SOI substrate depicted in FIG. 8 to provide an active region of a type IV semiconductor device 1000, and forming an isolation region 1100 adjacent to the active region. The isolation region 1100 may be composed of any dielectric, such as an oxide, nitride or oxynitride material. For example, the isolation region 1100 when composed of an oxide may be silicon oxide (SiO2) and the isolation region 1100 when composed of a nitride may be silicon nitride. In some embodiments, the isolation region 1100 may be formed using photolithography, etch and deposition processes. For example, an etch mask may be formed protecting the portion of the SOI layer 930 that provides the active region for the type IV semiconductor device 1000, and expose the portion of the SOI layer 930 that is removed to provide a trench for forming the isolation region 1100. The exposed portion of the SOI layer 930 may be removed by an etch process, which may be selective to the etch mask and the dielectric layer 920 of the SOI substrate. Following formation of the trenches, the etch mask may be removed and the trenches may be filled to provide the dielectric material of the isolation regions 1100. The dielectric material may be deposited using chemical vapor deposition (CVD) or other deposition methods. The material suitable for the material of the isolation regions 1100 may be the list of materials described above for the dielectric layer 1 10 that is described above with reference to FIG. 1. Following deposition, the dielectric material within the isolation regions 1100 may be planarized so that an upper surface of the dielectric material is coplanar with an upper surface of the SOI layer 930 of the SOI substrate.

FIG. 10 further shows III-V semiconductor material 30 within a trench 100 that is positioned in the isolation region 1100. The III-V semiconductor material 400 that is depicted in FIG. 10 is similar to the III-V semiconductor material 400 that is described above. For example, in the embodiment that is depicted in FIG. 10, after forming the trench 100, a via 200 is formed in a portion of the trench 100 through the entire depth of the isolation region 1100 to expose an upper surface of the base semiconductor layer 910. Similar to the semiconductor substrate 115 the exposed portion of the base semiconductor layer 910 provides a seed surface for the growth of the III-V semiconductor material 400. A low aspect ratio trench is then formed in the III-V semiconductor material.

FIG. 12 is a simplified depiction of two semiconductor devices as described above built of the structure of FIG. 10.

As discussed above the low aspect ratio trench can be at least partially filled with dielectric as part of the gate building process or the low aspect ratio trench can be separately and specifically filled with a dielectric material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are exemplary. There may be many variations to the diagrams or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of forming a semiconductor device, the method comprising:
   forming a trench in a dielectric layer, the dielectric layer being present on a semiconductor substrate;
   forming a via within the trench, wherein the via extending from a base of the trench present at a depth within the dielectric layer to an exposed upper surface of the semiconductor substrate;
   epitaxially forming a III-V semiconductor material extending from the exposed upper surface of the semiconductor substrate filling at least a portion of the trench;
   forming a trench in the epitaxially formed III-V semiconductor to result in a first III-V semiconductor area comprising the via and a second III-V semiconductor area free of the via, wherein the trench in the epitaxially formed III-V semiconductor extends from a top surface through a bottom surface of the epitaxially formed III-V semiconductor; and
   forming the semiconductor device on the second III-V semiconductor area.

2. The method of claim 1, further comprising filling the trench in the epitaxially formed III-V semiconductor with a dielectric material prior to forming the semiconductor device.

3. The method of claim 1, wherein the trench in the epitaxially formed III-V semiconductor is at least partially filled with a dielectric material during the formation of the semiconductor device.

4. The method of claim 1, wherein the III-V semiconductor material comprises aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlinAs), aluminum indium antimonide (AlinSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGainP), aluminum gallium arsenide phosphide (AlGaAsP), indium gallium arsenide phosphide (InGaAsP), indium arsenide antimonide phosphide (InArSbP), aluminum indium arsenide phosphide (AlinAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GainNAsSb), gallium indium arsenide antimonide phosphide (GainAsSbP), or a combination thereof.

5. The method of claim 1, wherein epitaxially forming the III-V semiconductor material comprises at least one of a solid epitaxial growth sources comprising In, Ga, N, P elements or a combination thereof, and a gas precursor comprising trimethylgallium (TMG), trimethylindium (TMI), tertiary-butylphosphine (TBP), phosphine ($PH_3$), ammonia ($NH_3$), or a combination thereof.

6. The method of claim 1, wherein the forming of the semiconductor device on the III-V semiconductor material that is present in the trench comprises forming a gate structure on a channel region portion of the III-V semiconductor material; and forming a source region and a drain region on opposing sides of the channel region portion.

7. The method of claim 1, wherein the III-V semiconductor material is in direct contact with the base of the trench provided by the dielectric layer.

8. The method of claim 1, wherein the semiconductor substrate comprises silicon, strained silicon, a silicon carbon alloy (SiC), silicon germanium (SiGe), a silicon germanium and carbon alloy (SiGeC), silicon alloys, germanium, germanium alloys, gallium arsenic, indium arsenic, or indium phosphide.

9. A method of forming a semiconductor substrate, the method comprising:
   forming a trench in a dielectric layer, the dielectric layer being present on the semiconductor substrate;
   forming a via within the trench, wherein the via extending from a base of the trench present at a depth within the dielectric layer to an exposed upper surface of the semiconductor substrate;
   epitaxially forming a III-V semiconductor material extending from the exposed upper surface of the semiconductor substrate filling at least a portion of the trench; and forming a low aspect ratio trench in the epitaxially formed III-V semiconductor material, wherein the low aspect ratio trench in the epitaxially formed III-V semiconductor material extends from a top surface through a bottom surface of the epitaxially formed III-V semiconductor material.

10. The method of claim 9, wherein the dielectric layer is comprised of an oxide, nitride or oxynitride material.

11. The method of claim 9, wherein the semiconductor substrate is comprised of a silicon including material.

12. The method of claim 9, wherein the III-V semiconductor material comprises aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlinAs), aluminum indium antimonide (AlinSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGainP), aluminum gallium arsenide phosphide (AlGaAsP), indium gallium arsenide phosphide (InGaAsP), indium arsenide antimonide phosphide (InArSbP), aluminum indium arsenide phosphide (AlinAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GainNAsSb), gallium indium arsenide antimonide phosphide (GainAsSbP), or a combination thereof.

13. The method of claim 9, wherein the trench in the dielectric layer has a width that is greater than a width of the via.

14. The method of claim 9, wherein the epitaxially forming of the III-V semiconductor material comprises a solid epitaxial growth sources comprising In, Ga, N, P elements or a combination thereof, and a gas precursor comprising trimethylgallium (TMG), trimethylindium (TMI), tertiary-butylphosphine (TBP), phosphine ($PH_3$), ammonia ($NH_3$), or a combination thereof.

15. The method of claim 9, wherein the semiconductor substrate comprises silicon, strained silicon, a silicon carbon alloy (SiC), silicon germanium (SiGe), a silicon germanium and carbon alloy (SiGeC), silicon alloys, germanium, germanium alloys, gallium arsenic, indium arsenic, or indium phosphide.

* * * * *